(12) United States Patent
Li et al.

(10) Patent No.: US 12,453,002 B2
(45) Date of Patent: Oct. 21, 2025

(54) REINFORCEMENT BOARD FOR FLEXIBLE PRINTED CIRCUIT BOARD, FLEXIBLE PRINTED CIRCUIT BOARD ASSEMBLY, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fei Li, Beijing (CN); Xinpeng Wang, Beijing (CN); Wenxiao Niu, Beijing (CN); Hao Huang, Beijing (CN); Zijian Wang, Beijing (CN); Xiaolong Zhu, Beijing (CN); Xu Lu, Beijing (CN); Hengzhen Liang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 868 days.

(21) Appl. No.: 17/642,956

(22) PCT Filed: May 14, 2021

(86) PCT No.: PCT/CN2021/093843
§ 371 (c)(1),
(2) Date: Mar. 15, 2022

(87) PCT Pub. No.: WO2021/249113
PCT Pub. Date: Dec. 16, 2021

(65) Prior Publication Data
US 2022/0338345 A1    Oct. 20, 2022

(30) Foreign Application Priority Data
Jun. 9, 2020 (CN) .......................... 202010517121.9

(51) Int. Cl.
H05K 1/02 (2006.01)
H05K 1/11 (2006.01)

(52) U.S. Cl.
CPC ........... H05K 1/0281 (2013.01); H05K 1/115 (2013.01); H05K 2201/2009 (2013.01)

(58) Field of Classification Search
CPC ................ H05K 1/0281; H05K 1/115; H05K 2201/2009; H05K 1/0215; H05K 1/02; H05K 1/11

(Continued)

(56) References Cited

U.S. PATENT DOCUMENTS

2004/0126547 A1* 7/2004 Coomer ................. H05K 3/107
428/209
2016/0054825 A1   2/2016 Fried
(Continued)

FOREIGN PATENT DOCUMENTS

CN     203661407 U  * 6/2014  ............... H05K 1/02
CN     205430771 U  * 8/2016  ............... H05K 1/02
(Continued)

OTHER PUBLICATIONS

International Search Report for PCT/CN2021/093843 Mailed Aug. 24, 2021.
(Continued)

Primary Examiner — Timothy J Thompson
Assistant Examiner — Guillermo J Egoavil
(74) Attorney, Agent, or Firm — Ling Wu; Stephen Yang; Ling and Yang Intellectual Property

(57) ABSTRACT

A reinforcement board for a flexible printed circuit, a flexible printed circuit assembly, and a display device. The reinforcement board for a flexible printed circuit comprises a substrate; the substrate comprises a first surface and a second surface which are opposite to each other; a through (Continued)

hole passing through the first surface and the second surface is provided on the substrate; the first surface, the second surface, and the wall of the through hole are all provided with a conductive layer; and the conductive layers on the first surface and the second surface are connected by means of the conductive layer on the wall of the through hole.

10 Claims, 3 Drawing Sheets

(58) Field of Classification Search
USPC .......................................................... 174/254
See application file for complete search history.

(56) References Cited

U.S. PATENT DOCUMENTS

| | | | |
|---|---|---|---|
| 2017/0123570 A1* | 5/2017 | Maruyama | G06F 3/044 |
| 2018/0180828 A1* | 6/2018 | Zhao | H05K 1/181 |
| 2020/0133047 A1 | 4/2020 | Isobe | |
| 2021/0318715 A1* | 10/2021 | Ha | H10K 59/121 |

FOREIGN PATENT DOCUMENTS

| | | | |
|---|---|---|---|
| CN | 206212401 U | 5/2017 | |
| CN | 209964366 U | 1/2020 | |
| CN | 210694474 U | 6/2020 | |
| CN | 111465180 A | 7/2020 | |
| WO | 2018235730 A1 | 12/2018 | |

OTHER PUBLICATIONS

The First Office Action dated Jan. 7, 2021 for Chinese Patent Application No. 202010517121.9 and English Translation.
The Second Office Action dated Jun. 15, 2021 for Chinese Patent Application No. 202010517121.9 and English Translation.
The Decision of Rejection dated Jan. 7, 2022 for Chinese Patent Application No. 202010517121.9 and English Translation.

* cited by examiner

REINFORCEMENT BOARD FOR FLEXIBLE PRINTED CIRCUIT BOARD, FLEXIBLE PRINTED CIRCUIT BOARD ASSEMBLY, AND DISPLAY DEVICE

CROSS-REFERENCE TO RELATED APPLICATIONS

The present disclosure is a U.S. National Phase Entry of International Application PCT/CN2021/093843 having an international filing date of May 14, 2021, which claims priority of Chinese patent application No. 202010517121.9 filed to CNIPA on Jun. 9, 2020, titled "Reinforcement Board for Flexible Printed Circuit Board, Flexible Printed Circuit Board Assembly, and Display Device", and the contents disclosed in the above-mentioned applications are hereby incorporated as a part of this application.

TECHNICAL FIELD

Embodiments of the present disclosure relate to, but are not limited to, the technical field of flexible printed circuit board, in particular to a reinforcement board for flexible printed circuit board, a flexible printed circuit board assembly and a display device.

BACKGROUND

Electronic products are widely used in daily life. At present, in an era of pursuing visual effects, full-screen display and large-screen display effects of electronic products such as mobile phones are increasingly favored by users. A display module is a core component of an electronic product for display. For a flexible organic light emitting diode (OLED) display device, a flexible printed circuit board (FPC) is an essential material. Reinforcement boards are required for reinforcement at some positions of the flexible printed circuit board. In some technologies, a reinforcement board is made of steel sheets (Steel Use Stainless, SUS), which cannot be considerably thick due to its weight, therefore requirement on thickness of the reinforcement board cannot be met in some cases.

SUMMARY

The following is a summary of subject matters described herein in detail. The summary is not intended to limit the scope of protection of claims.

An embodiment of the present disclosure provides a reinforcement board for flexible printed circuit board including a substrate, wherein the substrate includes a first surface and a second surface which are opposite to each other, the substrate is provided with a through hole penetrating the first surface and the second surface, each of the first surface, the second surface and a hole wall of the through hole is provided with a conductive layer, and the conductive layers on the first surface and the second surface are communicated with each other by the conductive layer on the hole wall of the through hole.

An embodiment of the present disclosure further provides a flexible printed circuit board assembly including a flexible printed circuit board and a reinforcement board for flexible printed circuit board, wherein the reinforcement board is fixed on the flexible printed circuit board by a conductive adhesive, and the conductive layer on the first surface or the second surface is connected to a ground wire of the flexible printed circuit board by the conductive adhesive.

An embodiment of the present disclosure further provides a display device including the flexible printed circuit board assembly.

Other aspects may be understood upon reading and understanding of the accompanying drawings and detailed descriptions.

BRIEF DESCRIPTION OF DRAWINGS

Accompanying drawings are used to provide further understanding of technical solutions of the present disclosure, constitute a part of the specification, and are used to explain the technical solutions of the present disclosure together with embodiments of the present disclosure, thus do not constitute a limitation on the technical solutions of the present disclosure.

DETAILED DESCRIPTION

Those of ordinary skills in the art should understand that modification or equivalent replacement may be made to technical solutions of the present disclosure without departing from the spirit and scope of the technical solutions of the present disclosure, and should fall within the scope of the claims of the present disclosure.

Figure 1:
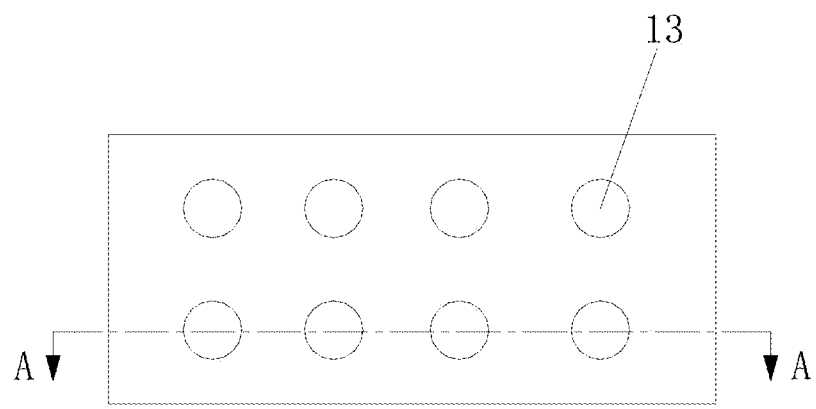
FIG. 1 is a schematic structural top view of a reinforcement board for flexible printed circuit board in some exemplary embodiments.
Figure 2:
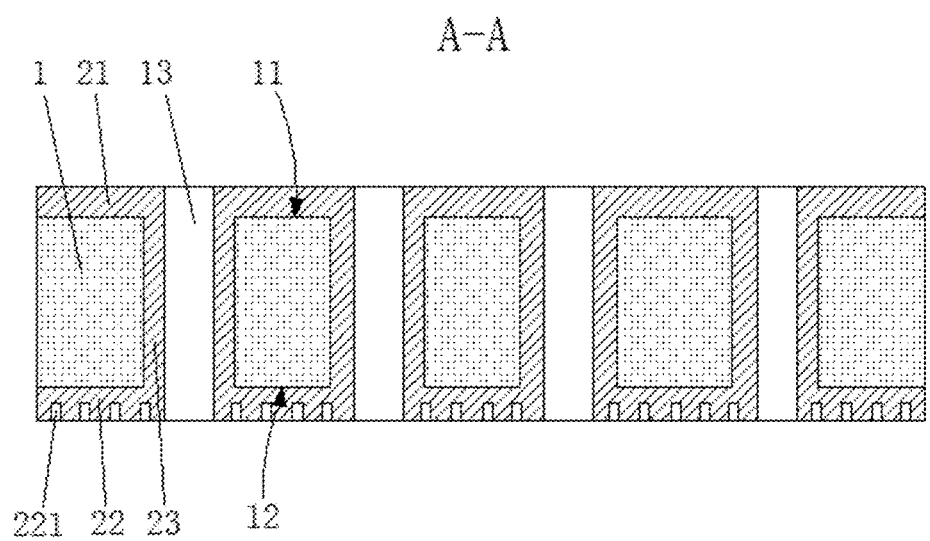
FIG. 2 is a sectional view taking along A-A in FIG. 1.

As shown in FIG. 1 and FIG. 2, an embodiment of the present disclosure provides a reinforcement board for flexible printed circuit board, the reinforcement board includes a substrate 1, the substrate 1 includes a first surface 11 and a second surface 12 which are opposite to each other, and the substrate 1 is provided with a through hole 13 penetrating the first surface 11 and the second surface 12, wherein a conductive layer is provided on each of the first surface 11, the second surface 12 and a hole wall of the through hole 13, and the conductive layers on the first surface 11 and the second surface 12 are communicated with each other by the conductive layer on the hole wall of the through hole 13.

In the reinforcement board for flexible printed circuit board of the embodiment of the present disclosure, the conductive layer on the first surface 11 of the substrate 1 is called a first conductive layer 21, the conductive layer on the second surface 12 of the substrate 1 is called a second conductive layer 22, and the conductive layer on the hole wall of the through hole 13 of the substrate 1 is called a third conductive layer 23. As shown in FIG. 2, the first conductive layer 21 and the second conductive layer 22 communicate with each other by the third conductive layer 23.

In the reinforcement board for flexible printed circuit board of the embodiment of the present disclosure, since the through hole 13 penetrating the opposite first surface 11 and second surface 12 of the substrate 1 is provided on the substrate 1, and the conductive layer is provided on each of the first surface 11 and second surface 12 of the substrate 1 and the hole wall of the through hole 13, and the conductive layers on the first surface 11 and second surface 12 are communicated with each other by the conductive layer on the hole wall of the through hole 13, the opposite outer surfaces of the reinforcement board are in a conductive state to meet a requirement for grounding of the reinforcement board. A material of the substrate 1 may be a light weight material, and the material of the substrate 1 may be an insulating material, so that compared with a scheme of using a steel sheet as the reinforcement board, in the embodiment of the present disclosure, when a thickness of the reinforcement board is designed to be large, the weight of the reinforcement board will not be too large.

In an embodiment of the present disclosure, the material of the substrate 1 may be a material with light weight and certain hardness (the reinforcement board requires hardness in a certain level). In some exemplary embodiments, the material of the substrate 1 may include an organic insulating material. In an example of this embodiment, the material of the substrate 1 may include a material of FR4 specification (FR4 is a code name of a fire-resistant material grade). The material of FR4 specification may be a composite material including epoxy resin, glass fiber and the like. The material of FR4 specification has a light weight, which can achieve a certain thickness without being too heavy. In a case that the material of FR4 specification is used as the substrate 1, the substrate 1 itself is not electrically conductive. The conductive layers provided on the first surface 11, the second surface 12 and the hole wall of the through hole 13 of the substrate 1 enable the two opposite outer surfaces of the reinforcement board to be in a conductive state, which can meet the requirement for grounding of the reinforcement board.

In some exemplary embodiments, the first surface 11 or the second surface 12 is a connecting surface facing the flexible printed circuit board when the reinforcement board is fixed on the flexible printed circuit board, and the conductive layer on the connecting surface is provided with multiple openings exposing or not exposing the connecting surface. In an example of this embodiment, as shown in FIG. 2, the second surface 12 is the connecting surface, and multiple openings 221 are formed on the second conductive layer 22, so that roughness of a corresponding outer surface of the reinforcement board can be increased by the multiple openings 221 provided on the second conductive layer 22, which is conducive to improving connection reliability between the reinforcement board and the flexible printed circuit board. In this example, the shape, size, number and arrangement of the multiple openings 221 on the second conductive layer 22 are not limited.

In some exemplary embodiments, the conductive layer on the connecting surface may be grid-shaped. In an example of the present embodiment, the second surface 12 is the connecting surface, and the second conductive layer 22 may be grid-shaped. The second conductive layer 22 may include multiple wires crossing each other, which may include multiple wires extending in a transverse direction and multiple wires extending in a longitudinal direction. Grid holes are formed between the multiple wires extending in the transverse direction and the multiple wires extending in the longitudinal direction, and the grid holes may be the openings 221 of the second conductive layer 22 that expose the second surface 12. In this example, the second surface 12 is the connecting surface, and the second conductive layer 22 is grid-shaped. The grid-shaped second conductive layer 22 can maximize the roughness of the corresponding outer surface of the reinforcement board, which is more conducive to improving the connection reliability between the reinforcement board and the flexible printed circuit board.

In the embodiment of the present disclosure, a material of the conductive layer is not limited, which may be metal and the like for example, as long as it meets requirement for electrical conductivity. In some exemplary embodiments, materials of the first conductive layer 21, the second conductive layer 22 and the third conductive layer 23 are all metals, and materials of the first conductive layer 21, the second conductive layer 22 and the third conductive layer 23 may be the same, such as copper, silver or metal alloy and the like. An electroless plating process can be used to form a conductive layer of metal material on the substrate 1.

In some exemplary embodiments, multiple through holes 13 are formed on the substrate 1. The multiple through holes 13 are provided, so that the first conductive layer 21 and the second conductive layer can be conducted by the third conductive layer 23 on the hole walls of the multiple through holes 13, thus conducting reliability of the first conductive layer 21 and the second conductive layer is increased. In this example, arrangement of the multiple through holes 13 is not limited. For example, the multiple through holes 13 can be arranged in an array, and for example, the multiple through holes 13 can be arranged in a matrix, as shown in FIG. 1.

In the embodiment of the present disclosure, the shape, size, number and arrangement of the through holes 13 are not limited. In some exemplary embodiments, a sectional shape of each through hole 13 may be circular, rectangular or polygonal.

Figure 3:
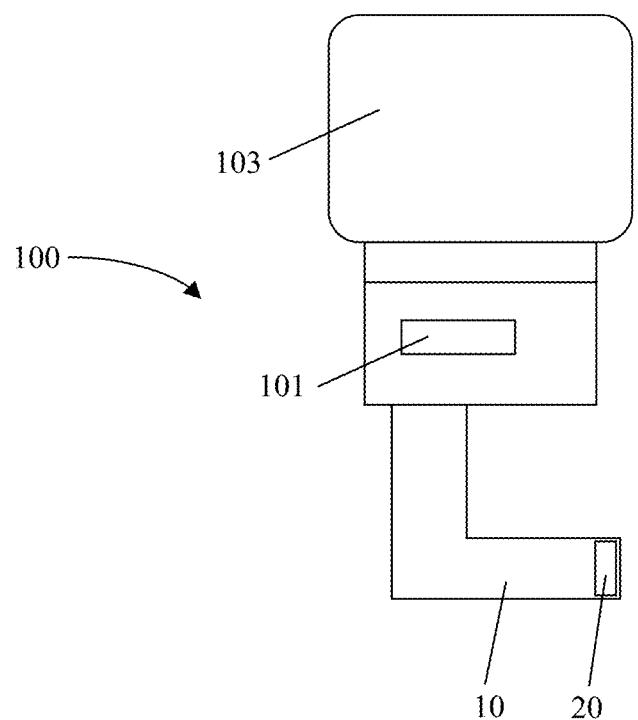
FIG. 3 is a schematic structural view of a flexible printed circuit board assembly according to some exemplary embodiments.
Figure 4:
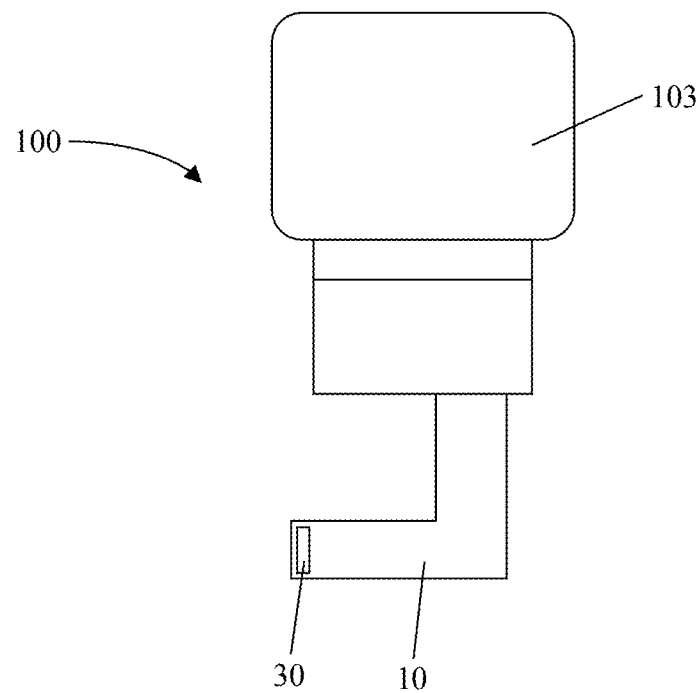
FIG. 4 is a schematic structural view of the flexible printed circuit board assembly of FIG. 3 from another perspective in some exemplary embodiments.
Figure 5:
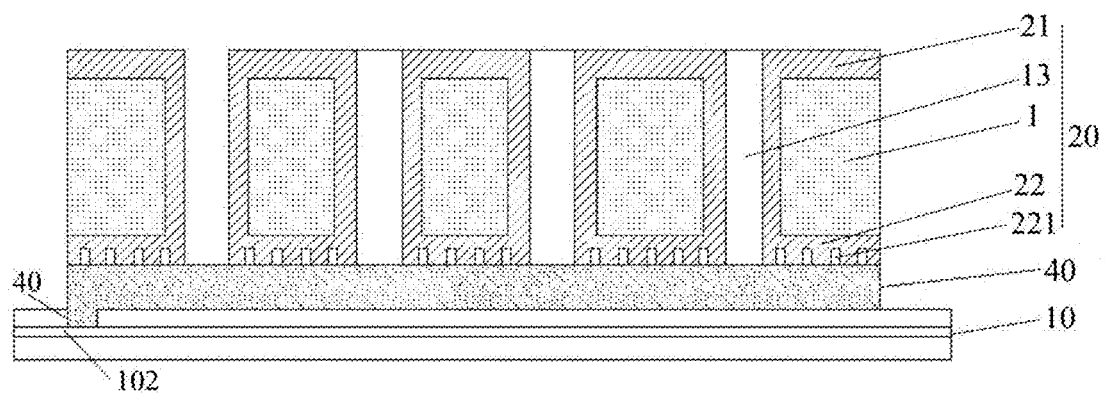
FIG. 5 is a schematic structural view of connection between a reinforcement board and a flexible printed circuit board in the flexible printed circuit board assembly of FIG. 3 in some exemplary embodiments.

As shown in FIG. 3 to FIG. 5, an embodiment of the present disclosure further provides a flexible printed circuit board assembly, which includes a flexible printed circuit board 10 and a reinforcement board 20 for flexible printed circuit board according to any of the previous embodiments, wherein the reinforcement board 20 is fixed on the flexible printed circuit board 10 by conductive adhesive 40, and a conductive layer on the first surface 11 or the second surface 12 is connected to a ground wire 102 of the flexible printed circuit board 10 by the conductive adhesive 40.

In the flexible printed circuit board assembly of the embodiment of the present disclosure, the reinforcement board 20 may be provided at a position of the flexible printed circuit board 10 where reinforcement is required, and the corresponding position of the flexible printed circuit board 10 can be reinforced by arrangement of the reinforcement board 20, so that the corresponding position of the flexible printed circuit board 10 can be prevented from warping. In addition, since the two opposite outer surfaces of the reinforcement board 20 in the embodiment of the present disclosure are conducted with each other, the flexible printed circuit board 10 can be grounded by the reinforcement board 20 in the embodiment of the present disclosure, which can meet requirements for grounding of the flexible printed circuit board 10.

In some exemplary embodiments, one outer surface of the reinforcement board 20 is attached to the flexible printed circuit board 10, wherein the first surface 11 or the second surface 12 is a connecting surface facing the flexible printed circuit board 10, and the conductive layer on the connecting surface is provided with multiple openings which expose or do not expose the connecting surface. In an example of this embodiment, as shown in FIG. 5, the second surface 12 is the connecting surface, and multiple openings 221 are formed on the second conductive layer 22, so that roughness of the corresponding outer surface of the reinforcement board 20 can be increased by the multiple openings 221 formed on the second conductive layer 22, which is conducive to adhesion connection between the reinforcement board 20 and the conductive adhesive 40 (in some examples, the conductive adhesive 40 may be a double-sided conductive tape with good electrical conductivity and adhesiveness), so that it is conducive to improving connection reliability between the reinforcement board 20 and the flexible printed circuit board 10. In this example, the shape, size, number and arrangement of the multiple openings 221 on the second conductive layer 22 are not limited. In some examples, the second conductive layer 22 may be grid-shaped, and the grid holes may be the openings 221 of the second conductive layer 22 that expose the second surface 12.

In some exemplary embodiments, as shown in FIG. 3 and FIG. 4, FIG. 3 and FIG. 4 are schematic structural views of two opposite surfaces of the flexible printed circuit board assembly respectively. The flexible printed circuit board assembly further includes a connector 30 provided on the flexible printed circuit board 10, the connector 30 and the reinforcement board 20 are provided at corresponding positions of the two opposite surfaces of the flexible printed circuit board 10 respectively, and the connector 30 is configured to connect the flexible printed circuit board 10 to an external circuit module. In this example, electronic components 101 are provided on the flexible printed circuit board 10, and the volume of the connector 30 is generally larger than that of most of the electronic components 101 on the flexible printed circuit board 10. The reinforcement board 20 is provided at a corresponding position on a surface of the flexible printed circuit board 10 facing away from the connector 30, so that strength of the position of the flexible printed circuit board 10 corresponding to the connector 30 can be increased, which facilitates the connection between the connector 30 and the flexible printed circuit board 10, and can prevent the position of the flexible printed circuit board 10 corresponding to the connector 30 from warping.

An embodiment of the present disclosure further provides a display device which includes the flexible printed circuit board assembly in any one of the aforementioned embodiments.

In some exemplary embodiments, the display device 100 further includes a display screen 103 and a display module for driving the display screen 103 to display, and the display module includes the flexible printed circuit board assembly. The flexible printed circuit board 10 may be a main flexible printed circuit board (MFPC) that drives the display screen to display. The display screen may be an OLED flexible display screen. The display device may further include a motherboard and a metal casing, and the connector 30 in the flexible printed circuit board assembly may be connected to the motherboard, and the flexible printed circuit board 10 is connected to the motherboard by the connector 30. The reinforcement board 20 may be connected to the metal casing of the display device to achieve grounding of the flexible printed circuit board 10. In some examples, the connector 30 may be provided with a ground wire, and the ground wire of the connector 30 may be connected to the conductive layer of the reinforcement board 20 by a via hole formed in the flexible printed circuit board 10 (a hole wall of the via hole is provided with a metal layer), so that the grounding of the connector 30 can be achieved.

The display device of the present disclosure may be any product or component with a display function, such as a mobile phone, a tablet computer, a television, a laptop computer, a digital camera, or a navigator and the like.

In the description herein, orientation or positional relations indicated by terms "up", "down", "left", "right", "top", "inside", "outside", "axial direction", "four corners" and the like are based on the orientation or positional relations shown in the drawings, and are only for simplifying brief description of the present disclosure and are not intended to indicate or imply that the structures referred to must have a specific orientation, or be constructed and operated in a specific orientation, and therefore they should not be construed as limitations on the present disclosure.

In the description herein, the terms "connection", "fixed connection", "installation" and "assembly" are to be understood broadly, for example, a connection may be a fixed connection, or a detachable connection, or may be an integral connection, unless explicitly specified and defined otherwise. The terms "installation", "connection" and "fixed connection" may refer to a direct connection, or may an indirect connection by an intermediate medium, or may be an internal connection between two elements. Those of ordinary skills in the art may understand the meanings of the above terms herein.

The invention claimed is:

1. A reinforcement board for flexible printed circuit board, comprising a substrate, wherein the substrate comprises a first surface and a second surface which are opposite to each other, the substrate is provided with a through hole penetrating through the first surface and the second surface, wherein each of the first surface, the second surface and a hole wall of the through hole is provided with a conductive layer, the conductive layers on the first surface and the second surface are communicated with each other by the conductive layer on the hole wall of the through hole, and the second surface is a connecting surface facing the flexible printed circuit board when the reinforcement board is fixed on the flexible printed circuit board; and the conductive layer on the second surface is grid-shaped, the conductive layer on the second surface comprises a plurality of wires crossing each other, the plurality of wires crossing each other comprise a plurality of wires extending in a transverse direction and a plurality of wires extending in a longitudinal direction, grid holes are formed between the plurality of wires extending in the transverse direction and the plurality of wires extending in the longitudinal direction, and the grid holes are a plurality of openings which expose or do not expose the second surface.

2. The reinforcement board for flexible printed circuit board according to claim 1, wherein a material of the substrate comprises an organic insulating material.

3. The reinforcement board for flexible printed circuit board according to claim 2, wherein the material of the substrate comprises a material of FR4 standard.

4. The reinforcement board for flexible printed circuit board according to claim 1, wherein a material of the conductive layer is metal.

5. The reinforcement board for flexible printed circuit board according to claim 1, wherein the substrate is provided with a plurality of through holes, and the plurality of through holes are arranged in an array.

6. The reinforcement board for flexible printed circuit board according to claim 1, wherein a sectional shape of the through hole is circular, rectangular or polygonal.

7. A flexible printed circuit board assembly comprising a flexible printed circuit board and the reinforcement board for flexible printed circuit board according to claim 1, wherein the reinforcement board is fixed on the flexible printed circuit board by conductive adhesive, and the conductive layer on the second surface is connected to a ground wire of the flexible printed circuit board by the conductive adhesive.

8. The flexible printed circuit board assembly according to claim 7, further comprising a connector provided on the flexible printed circuit board, the connector and the reinforcement board are provided at corresponding positions on two opposite surfaces of the flexible printed circuit board respectively, and the connector is configured to connect the flexible printed circuit board to an external circuit module.

9. A display device, comprising a display screen and a display module for driving the display screen to display, wherein the display module comprises the flexible printed circuit board assembly according to claim 7.

10. A display device, comprising a display screen and a display module for driving the display screen to display, wherein the display module comprises the flexible printed circuit board assembly according to claim 8.

* * * * *